United States Patent [19]
Bezama et al.

[11] Patent Number: 5,870,823
[45] Date of Patent: *Feb. 16, 1999

[54] METHOD OF FORMING A MULTILAYER ELECTRONIC PACKAGING SUBSTRATE WITH INTEGRAL COOLING CHANNELS

[75] Inventors: Raschid J. Bezama, Mahopac; Jon A. Casey, Poughkeepsie, both of N.Y.; John B. Pavelka, Austin, Tex.; Glenn A. Pomerantz, Kerhonkson, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 756,362
[22] Filed: Nov. 27, 1996
[51] Int. Cl.$^6$ ............................... H05K 3/22; H05K 3/46
[52] U.S. Cl. .............................. 29/848; 29/830; 29/832; 29/851; 165/80.4; 174/15.1; 257/703; 257/713; 257/714; 361/698; 361/699
[58] Field of Search ...................... 361/689, 698, 361/699, 704; 257/700, 703, 712, 713, 714; 174/52.1, 52.2, 52.3, 52.4, 15.1; 165/80.4, 80.5; 29/830, 832, 851, 848, 849, 855

[56] References Cited

U.S. PATENT DOCUMENTS

| | | | |
|---|---|---|---|
| 2,727,632 | 12/1955 | Mack | 29/851 X |
| 4,327,399 | 4/1982 | Sasai et al. | 361/698 |
| 4,562,092 | 12/1985 | Wiech, Jr. | 29/751 X |
| 4,739,443 | 4/1988 | Singhdeo | 361/689 |
| 5,034,688 | 7/1991 | Moulene et al. | 165/80.4 X |
| 5,099,311 | 3/1992 | Bonde et al. | 257/713 X |
| 5,099,910 | 3/1992 | Walpole et al. | 165/80.4 |
| 5,158,912 | 10/1992 | Kellerman et al. | 29/851 X |
| 5,218,515 | 6/1993 | Bernhardt | 361/689 |
| 5,313,361 | 5/1994 | Martin | 361/699 |
| 5,317,478 | 5/1994 | Sobhani | 361/689 |
| 5,436,793 | 7/1995 | Sanvo et al. | 361/689 |
| 5,495,889 | 3/1996 | Dubelloy | 361/689 |
| 5,506,753 | 4/1996 | Bertin et al. | 361/689 X |
| 5,510,958 | 4/1996 | Shimabara et al. | 361/719 |
| 5,655,290 | 8/1997 | Moresco et al. | 29/830 |
| 5,669,136 | 9/1997 | Magee | 29/830 |

FOREIGN PATENT DOCUMENTS

| | | | |
|---|---|---|---|
| 4916086 | 4/1974 | Japan | 29/851 |
| 5299843 | 11/1993 | Japan | 29/851 |
| 6512142 | 5/1994 | Japan | 29/851 |

OTHER PUBLICATIONS

L. F. Miller, Channels, Tunnels and Projections in Ceramic Slips, vol. 13, No. 3, Aug. 1970, p. 610.

H. D. Edmonds and G. Markovits, Heat Exchange Element For Semiconductor Device Cooling, vol. 23, No. 3, Aug. 1980, p. 1057.

Primary Examiner—Peter Vo
Attorney, Agent, or Firm—Ira D. Blecker

[57] ABSTRACT

Disclosed is an electronic packaging substrate which includes a sintered ceramic body having at least one internal layer of wiring and at least one cooling channel internal to and integral with the sintered ceramic body for cooling a heat-generating electronic device placed on the sintered body. Also disclosed is a method of making the electronic packaging substrate.

18 Claims, 2 Drawing Sheets

METHOD OF FORMING A MULTILAYER ELECTRONIC PACKAGING SUBSTRATE WITH INTEGRAL COOLING CHANNELS

BACKGROUND OF THE INVENTION

The present invention relates to a multilayer ceramic substrate for packaging semiconductor devices and similar heat generating devices. More particularly, the invention relates to a multilayer ceramic substrate having cooling channels for cooling a semiconductor device, or other similar heat generating device, placed on the substrate.

Multilayer ceramic (MLC) substrates are used for interconnecting a semiconductor device or similar heat generating device (hereafter collectively referred to as semiconductor device(s)) to the next level of packaging such as a board. The MLC substrates provide wiring circuitry which provides for the transmission of signals and power to and from the semiconductor device. In addition, the typical MLC substrate may provide some level of cooling of the semiconductor device via transfer of heat from the semiconductor device through the MLC substrate. It is more usual to provide some external apparatus, such as a cap and heat sink, to remove heat from the semiconductor device. This external apparatus often has internal channels for the flow of a cooling fluid. Numerous proposals have been made for removing the heat generated by semiconductor devices by such external apparatus.

Edmonds et al. IBM Technical Disclosure Bulletin, 23, No. 3, p. 1057 (August 1980), the disclosure of which is incorporated by reference herein, discloses a heat exchange element having internal cooling channels built up on the back of the semiconductor device. Such an arrangement, of course, makes the semiconductor device very expensive and risks damage to the semiconductor device during processing of the heat exchange element. Also of interest is Miller IBM Technical Disclosure Bulletin, 13, No. 3, p. 610 (August 1970), the disclosure of which is incorporated by reference herein, which discloses a ceramic body having internal channels.

Moulene et al. U.S. Pat. No. 5,034,688, the disclosure of which is incorporated by reference herein, discloses a temperature controlled platen for supporting, for example, a semiconductor wafer. The platen is made of ceramic and contains a cavity inside the platen. Inside the cavity is a spiral tube which can convey a fluid for heating or cooling the platen.

Bonde et al. U.S. Pat. No. 5,099,311, the disclosure of which is incorporated by reference herein, discloses a microchannel heat sink which consists of a microchannel layer and a manifold. A thermal fluid is circulated through the microchannels for cooling or heating, for example, an integrated circuit. Walpole et al. U.S. Pat. No. 5,099,910, the disclosure of which is incorporated by reference herein, is similar to Bonde et al. in that a microchannel heatsink is disclosed.

Bernhardt U.S. Pat. No. 5,218,515, the disclosure of which is incorporated by reference herein, discloses a microchannel heatsink permanently bonded to the back of a chip. A cooling fluid circulates through the microchannels to cool the chip.

Bertin et al. U.S. Pat. No. 5,506,753, the disclosure of which is incorporated by reference herein, discloses a plurality of stacked semiconductor devices wherein the backside of each contains grooves for cooling. The chips are stacked so that the grooved side of the chip is stacked against the active side of the next chip. A cooling fluid may be circulated within the grooves.

All of the above thermal apparatus are separate and apart from the substrate to which the semiconductor device is joined and provide no electrical function with respect to the semiconductor device.

It would be desirable to have a substrate which provides electrical function with respect to the semiconductor device and yet also provides improved cooling to handle the most rigorous cooling requirements for today's high heat-generating semiconductor devices.

Accordingly, it is a purpose of the present invention to have an improved substrate that provides both electrical function and cooling function with respect to a semiconductor device mounted on the substrate.

It is another purpose of the present invention to have an improved substrate that can handle the cooling requirements of high heat-generating semiconductor devices.

These and other purposes of the invention will become more apparent after referring to the following description considered in conjunction with the accompanying drawings.

BRIEF SUMMARY OF THE INVENTION

One aspect of the invention relates to a multilayer ceramic substrate comprising:

a. a sintered ceramic body having at least one internal layer of wiring; and b. at least one cooling channel internal to and integral with the sintered ceramic body for cooling at least one heat-generating electronic device placed on the sintered body.

A second aspect of the invention relates to a method of forming a multilayer ceramic substrate having one or more cooling channels, the method comprising the steps of:

a. obtaining a plurality of ceramic greensheets, some of which are particularly designed for a first portion of a substrate and the remainder of which are particularly designed for a second portion of a substrate, wherein at least one of the plurality of greensheets has wiring metallization thereon;

b. laminating the ceramic greensheets which are particularly designed for the first portion of the substrate to form a first laminate;

c. laminating the ceramic greensheets which are particularly designed for the second portion of the substrate to form a second laminate;

d. machining at least one cooling channel in at least one of the first and second laminates;

e. combining the first laminate and the second laminate together to form an unsintered substrate wherein the at least one cooling channel is internal to the unsintered substrate and the wiring metallization is separate from the at least one cooling channel; and f. sintering the unsintered substrate to form a multilayer ceramic substrate having at least one cooling channel for cooling at least one heat-generating electronic device and having at least one layer of wiring metallization.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
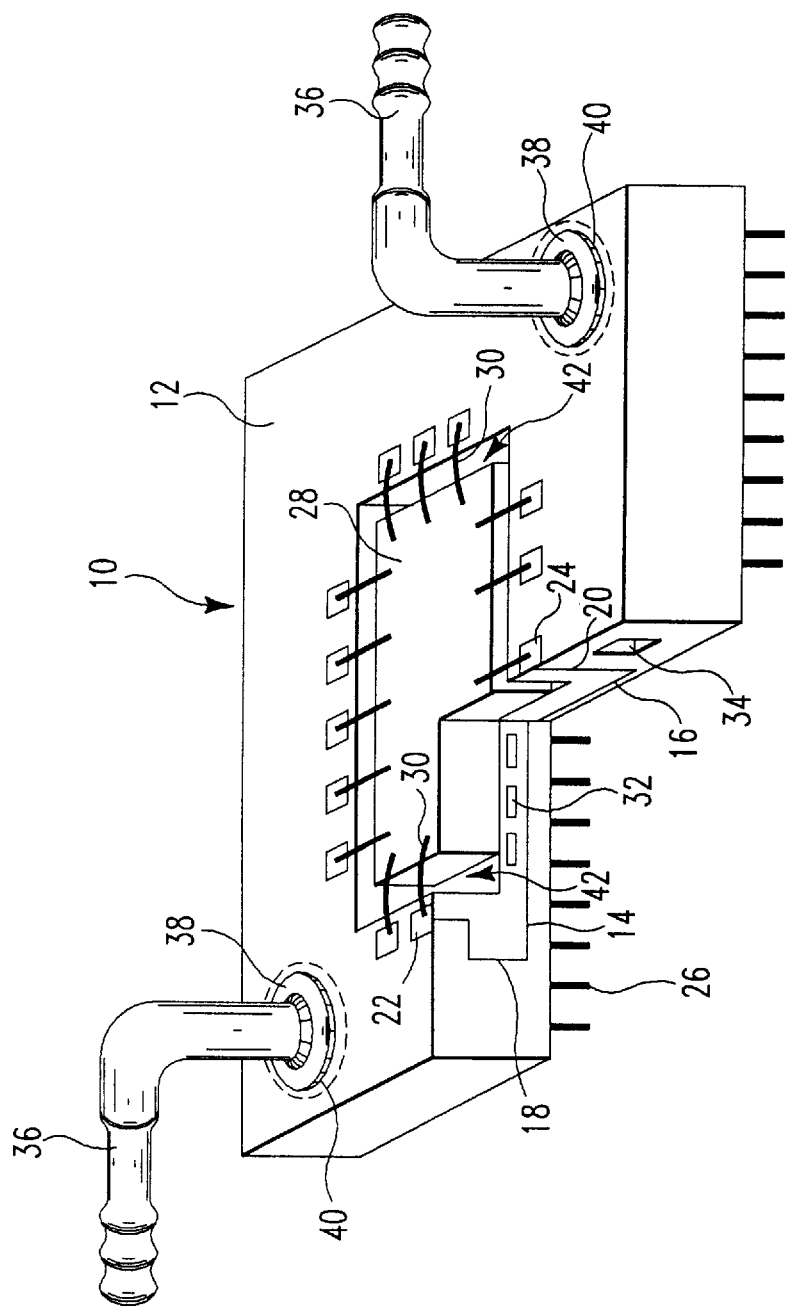
FIG. 1 is a partially cutaway perspective view of the multilayer ceramic substrate according to the present invention.

Referring to the drawings in more detail, and in particular referring to FIG. 1, there is disclosed a multilayer ceramic (MLC) substrate, generally indicated by 10. The MLC substrate 10 is comprised of a sintered ceramic body 12 having at least one internal layer of wiring 14. There may be at least a second internal layer of wiring 16.

The more complex the electrical function of the MLC substrate, the more layers of wiring that will be present. In addition, the internal layers of wiring 14, 16 usually will be electrically connected to other layers of wiring, to input/output (I/O) pins or pads, to wire bonding pads for connection to a semiconductor device or to controlled collapse chip connection (C4) pads for connection to a semiconductor device. As shown in FIG. 1, internal layer of wiring 14 has a vertical section 18 of wiring that makes connection with wire bonding pad 22 and internal layer of wiring 16 has a vertical section 20 of wiring that makes connection with wire bonding pad 24. While not shown, there will usually also be internal wiring connections to I/O pins 26. In this way, a semiconductor device 28 through wires 30 can be electrically connected to I/O pins 26. Such an MLC substrate is fully functional to handle the transmittance of signals and power to and from the semiconductor device 28.

Modern day semiconductor devices generate a lot of heat during operation; as much as 50–75 watts/cm$^2$. This heat generation is expected to increase as the semiconductor devices become more powerful. Thus, there is a need to dissipate this heat before it causes damage to the semiconductor device.

The present inventors have proposed adding to the MLC substrate 10 at least one cooling channel 32 (although there will usually be a plurality of such cooling channels 32) internal to and integral with the sintered ceramic body 12 for cooling at least one semiconductor device 28 placed on the sintered ceramic body 12. There may, of course, be more than one semiconductor device 28 placed on the sintered ceramic body 12. It is essential to maintain the cooling channels 32 separate from any wiring in the substrate so as to avoid short circuiting the function of the MLC substrate 10. This requires that the sintered ceramic body 12 not be porous since any connected porosity could allow the cooling fluid (not shown) to contact the wiring of the MLC substrate 10, thereby effectively destroying the function of the MLC substrate 10.

To obtain the greatest cooling efficiency, the plurality of cooling channels 32 should be positioned as close as possible to the semiconductor device 28. Flow into and out of the plurality of cooling channels 32 is controlled by manifold 34 and flanged tubes 36. Preferably, flange 38 of each of the flanged tubes 36 is bonded to the sintered ceramic body 12. Bonding is preferably by a solder, such as eutectic lead/tin solder, which is compatible with both the flanged tubes and the ceramic material. By way of illustration and not limitation, the flanged tubes may be made from brass.

Also by way of illustration and not limitation, the ceramic material that comprises the sintered ceramic body 12 may be alumina, glass plus ceramic, glass-ceramic (starts as a glass but at least partially transforms to a ceramic material) and aluminum nitride.

Semiconductor device 28 may sit on top of sintered body 12 or, as shown in FIG. 1, the semiconductor device 28 sits in cavity 42 and is electrically connected to the sintered body 12 by wires 30.

The cooling fluid may be, for example, water, freon, ethylene glycol or other similar materials.

The method of forming the MLC substrate 10 of FIG. 1 will now be described. First, a plurality of ceramic greensheets for a first or top portion of the MLC substrate 10 are obtained and laminated. These ceramic greensheets, punched and screened with metallic paste as required to provide the desired electrical connectivity pattern in the final ceramic body, have been particularly chosen to function as the first or top portion of the MLC substrate 10.

Next, a plurality of ceramic greensheets for a second or bottom portion of the MLC substrate are obtained and laminated. These ceramic greensheets, punched and screened with metallic paste as required to provide the desired electrical connectivity pattern in the final ceramic body, have been particularly chosen to function as the second or bottom portion of the MLC substrate 10.

The lamination of the first and second portions may take place under normal laminating conditions. For example, lamination pressure may be about 4000 psi and the lamination temperature is about 75 degrees Centigrade.

One or both of the first and second portions contains wiring metallization. The choice of where to place the wiring metallization will be dictated by design considerations.

By way of illustration and not limitation, the ceramic material of the ceramic greensheets may be alumina, glass plus ceramic, glass-ceramic and aluminum nitride.

Figure 2:
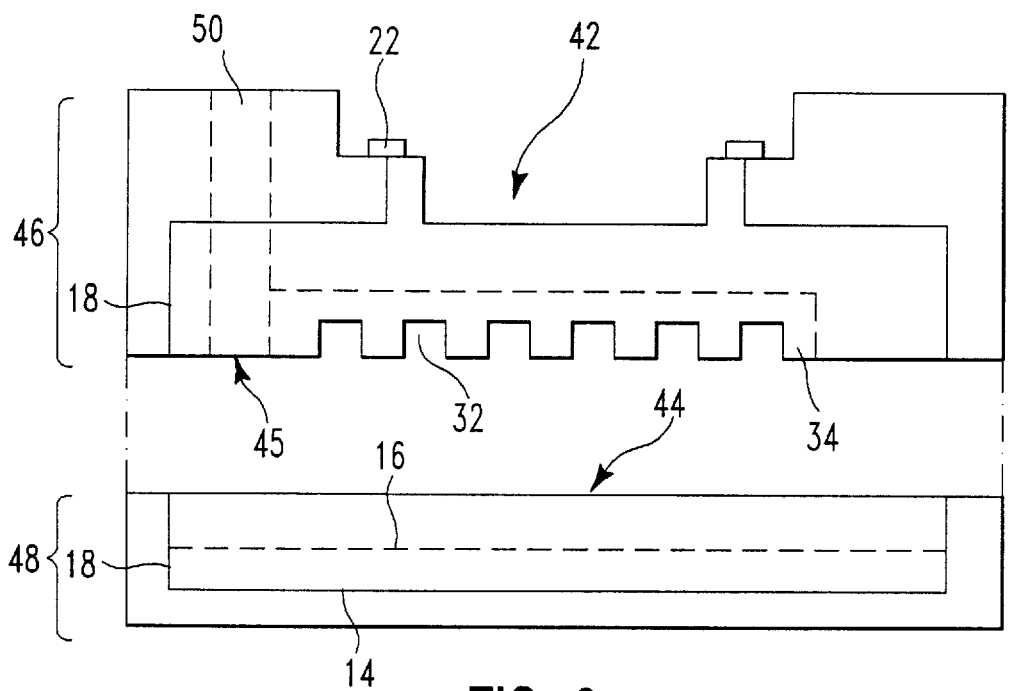
FIG. 2 is a cross sectional view illustrating one step of manufacturing the multilayer ceramic substrate according to the present invention.

Referring now to FIG. 2, there is shown first or top portion 46 having a cavity 42 and internal wiring 18 leading to wire bonding pad 22. In addition, cooling channels 32 and manifold 34 have been machined into the first or top portion 46. At present, the cooling channels 32 are open ended. Also shown in FIG. 2, is second or bottom portion 48 having at least one layer of wiring metallization 14. There may also be a second layer of wiring metallization 16. It should be understood that while wiring metallization layers 14, 16 are shown in second or bottom portion 48, it is within the scope of the present invention for wiring metallization layers 14, 16 to be located wholly within first or top portion 46 for an appropriate packaging application. In addition, wiring metallization 14 may connect to wire bonding pad 22 by wiring metallization 18. While not shown in FIG. 2, cooling channels 32 and manifold 34 may alternatively be machined in second or bottom portion 48.

Next, first or top portion 46 is combined with second or bottom portion 48 to form an unsintered ceramic body. As can be appreciated, surface 44 of second or bottom portion 48 will meet with surface 45 of first or top portion 46. Surface 44 thus closes the otherwise open ended cooling channels 32. The step of combining may be by lightly laminating the two portions 46, 48 at a lamination pressure of about 500 psi and at a lamination temperature above room temperature (e.g., 75 degrees Centigrade).

Alternatively, the two portions 46, 48 may be combined by an adhesive. The preferred adhesive is an aqueous-based acrylic emulsion. Such acrylic emulsions are available in numerous grades/types which allows the user to tailor the properties of the adhesive (e.g. Tg, thermoplastic or thermoset) to the specific application. The acrylic emulsions are available from a number of suppliers such as Rohm & Haas and Dow Chemical. For purposes of the present invention, we have found Rhoplex HA8 and Rhoplex HA16, (both from Rohm & Haas) added together in an approximate ratio of 50:50 (by volume), to be particularly suitable. The HA series of adhesive is a thermally cross-linking system. Also suitable for use are the AC series of Rhoplex (from Rohm & Haas), which have similar properties to the HA series of Rhoplex except they do not cross-link and so are thermoplastic in nature. The acrylic emulsion, as discussed above, is diluted by 50% (by volume) by deionized water to form the aqueous-based acrylic emulsion adhesive.

While organic-based adhesives are not as preferred, one may use an organic-based adhesive including an organic solvent such as isopropyl alcohol or ethyl acetate plus a binder such as polyvinyl butyral. The polyvinyl butyral may typically be added to the solvent in the amount of 5–10% by weight.

Lastly, the unsintered ceramic body is sintered at a sintering temperature and under a suitable protective atmosphere that is appropriate for the ceramic/metal composite utilized in making the MLC substrate 10.

At some point in the processing of the ceramic body 12, two perforations need to be formed in the ceramic body 12 for connecting with manifold 34 and thus also with cooling channels 32. One perforation will serve to allow the entry of a cooling fluid while the other perforation will serve to allow the exit of a cooling fluid. As shown in FIG. 2, perforation 50 may be formed in the first or top portion 46 prior to the combining of the two portions 46, 48. The perforation 50 may be formed, for example by machining(after the first or top portion 46 has been laminated and before final lamination with the second or bottom portion 48) a blind hole with a 20–30 mil thick hole cover. The hole cover is drilled through or removed after sintering. This is the most preferred method. It is also possible to completely drill perforation 50 before final lamination but it is preferred to have the hole cover to avoid deformation during sintering and also to avoid leakage of liquids into the hole during post-sintering processing. Alternatively, the individual ceramic greensheets could have been perforated so that upon stacking and laminating, perforation 50 would have been formed. It is also possible to drill perforation 50 after the two portions 46, 48 have been laminated. Lastly, it is also possible, although not desirable, to drill perforation 50 after the ceramic body 12 has been sintered.

In an alternative method of forming the MLC substrate 10 of FIG. 1, a plurality of ceramic greensheets may be formed which have perforated or cutout areas corresponding to cavity 42, cooling channels 32, manifold 34 and perforation 50. The plurality of ceramic greensheets may be stacked and laminated all at once. More preferably, the ceramic greensheets are stacked sequentially. By sequentially, it is meant that a ceramic greensheet is laminated to another ceramic greensheet to start the stack of greensheets and then subsequent greensheets are added to the stack, and laminated, one at a time until all ceramic greensheets have been stacked and laminated. For this method of lamination, low lamination pressures (with or without heat) of about 500 psi or less are used. Sintering is accomplished as before.

Figure 3:
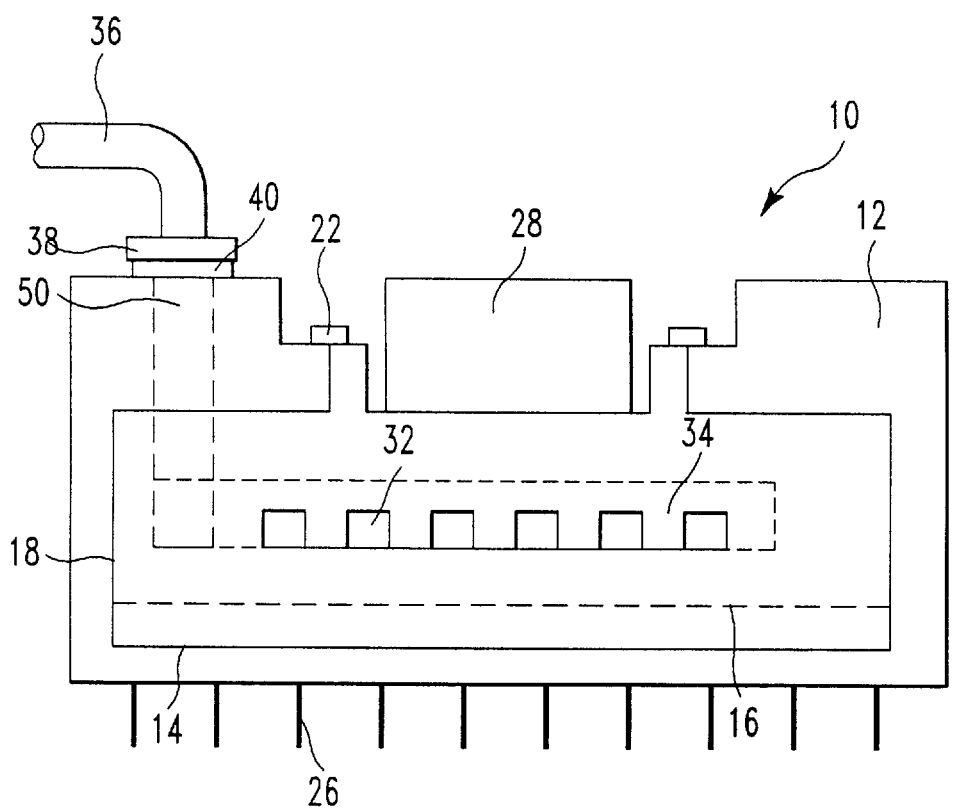
FIG. 3 is a full cross sectional view of the multilayer ceramic substrate according to the present invention in FIG. 1.

Referring now to FIG. 3, the finished MLC substrate 10 is shown. Flange 38 of flanged tube 36 is bonded to the sintered ceramic body 12, preferably by solder 40, at the location where perforation 50 exits from the ceramic body 12. In this manner, cooling fluid can enter or exit the ceramic body via flanged tubes 36, perforations 50, manifold 34 and cooling channels 32.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a multilayer ceramic substrate having one or more cooling channels, the method comprising the steps of:
    a. obtaining a plurality of ceramic greensheets, at least two of which are particularly designed for a first portion of a substrate and at least two of which are particularly designed for a second portion of a substrate, wherein at least one of the plurality of greensheets has wiring metallization thereon;
    b. laminating the ceramic greensheets which are particularly designed for the first portion of the substrate to form a first laminate;
    c. laminating the ceramic greensheets which are particularly designed for the second portion of the substrate to form a second laminate, wherein at least one of the first and second laminates contains the at least one greensheet having wiring metallization, the at least one greensheet having wiring metallization being situated within the at least one of the first and second laminates so that when the at least one of the first and second laminates is subsequently machined to form at least one cooling channel, the wiring metallization will not be machined nor will the wiring metallization be exposed to the at least one cooling channel;
    d. machining at least one cooling channel in at least one of the first and second laminates;
    e. combining the first laminate and the second laminate together to form an unsintered substrate wherein the at least one cooling channel is internal to the unsintered substrate and the wiring metallization is separate from the at least one cooling channel; and
    f. sintering the unsintered substrate to form a multilayer ceramic substrate having at least one cooling channel for cooling at least one heat-generating electronic device and having at least one layer of wiring metallization.

2. The method of claim 1 wherein at least one of the first and second laminates has a cavity for receiving the at least one heat-generating electronic device.

3. The method of claim 1 wherein the step of combining is by laminating the first and second laminates at a pressure of 500 psi or less and at a temperature above room temperature.

4. The method of claim 1 wherein the step of combining is by adhering the first and second laminates together.

5. The method of claim 4 wherein an aqueous-based acrylic emulsion is used for adhering the first and second laminates together.

6. The method of claim 1 further comprising the step of perforating the first or second laminate prior to the step of combining so as to form at least one perforation at a predetermined location so that the at least one perforation communicates with the at least one cooling channel.

7. The method of claim 1 further comprising the step of perforating the first or second laminate after the step of combining but prior to the step of sintering so as to form at least one perforation at a predetermined location so that the at least one perforation communicates with the at least one cooling channel.

8. The method of claim 1 further comprising the step of perforating the first or second laminate after the step of sintering so as to form at least one perforation at a predetermined location so that the at least one perforation communicates with the at least one cooling channel.

9. The method of claim 1 further comprising the step of soldering at least one flange onto the substrate after the step of sintering.

10. The method of claim 1 wherein the ceramic material of the ceramic greensheets is selected from the group consisting of alumina, glass plus ceramic, glass-ceramic and aluminum nitride.

11. The method of claim 1 wherein the at least one internal layer of wiring of the multilayer ceramic substrate is capable of carrying signals or power from or to the at least one heat generating electronic device.

12. The method of claim 1 wherein the step of machining comprises machining a plurality of cooling channels in at least one of the first and second laminates.

13. A method of forming a multilayer ceramic substrate having one or more cooling channels, the method comprising the steps of:

a. obtaining a plurality of ceramic greensheets, at least two of which are particularly designed to be internal to the substrate and have perforated areas, at least two of which have no perforated areas, wherein at least one of the plurality of ceramic greensheets has wiring metallization thereon, the wiring metallization being designed so as to be spaced from the perforated areas;

b. laminating the plurality of ceramic greensheets at a pressure of 500 psi or less to form an unsintered substrate wherein the perforated areas of the internal ceramic greensheets form at least one cooling channel internal to the unsintered substrate and the wiring metallization on at least one of the plurality of ceramic greensheets is spaced from the at least one cooling channel; and c. sintering the unsintered substrate to form a multilayer ceramic substrate having at least one cooling channel for cooling at least one heat-generating electronic device and having at least one layer of wiring metallization.

14. The method of claim 13 wherein the ceramic greensheets are laminated sequentially.

15. The method of claim 13 wherein the unsintered substrate has a cavity for receiving the at least one heat-generating electronic device.

16. The method of claim 13 further comprising the step of soldering at least one flange onto the substrate after the step of sintering.

17. The method of claim 13 wherein the ceramic material of the ceramic greensheets is selected from the group consisting of alumina, glass plus ceramic, glass-ceramic and aluminum nitride.

18. The method of claim 13 wherein the at least one internal layer of wiring of the multilayer ceramic substrate is capable of carrying signals or power from or to the at least one heat generating electronic device.

* * * * *